United States Patent [19]

Fulop et al.

[11] 4,260,427
[45] Apr. 7, 1981

[54] CdTe SCHOTTKY BARRIER PHOTOVOLTAIC CELL

[75] Inventors: Gabor F. Fulop, King of Prussia; Jacob F. Betz, Quakertown; Peter V. Meyers, Coopersburg; Mitchell E. Doty, Chalfont, all of Pa.

[73] Assignee: Ametek, Inc., Paoli, Pa.

[21] Appl. No.: 49,728

[22] Filed: Jun. 18, 1979

[51] Int. Cl.$^3$ .............................................. H01L 31/04
[52] U.S. Cl. ..................................... 136/255; 136/260; 204/86; 357/15; 357/30; 427/76
[58] Field of Search .......... 136/89 SJ, 89 CD, 89 ST, 136/89 TF; 357/15, 30; 427/76

[56] References Cited

U.S. PATENT DOCUMENTS

| 3,982,260 | 9/1976 | Wald | 357/15 |
| 4,035,197 | 7/1977 | Raychaudhuri | 136/89 CD |
| 4,192,721 | 3/1980 | Fawcett et al. | 204/14 N |

FOREIGN PATENT DOCUMENTS

| 2844712 | 4/1979 | Fed. Rep. of Germany | 136/89 CD |
| 1532616 | 11/1978 | United Kingdom | 136/89 CD |

OTHER PUBLICATIONS

Proceedings: Photovoltaics Advanced Materials Review Meeting, Oct. 1978, published Jan. 1979, SERI/T-P-49-105, Conf. 781017, pp. 485-491.
M. P. R. Panicker et al, "Cathodic Deposition of CdTe from Aqueous Electrolytes", *J. Electrochem. Soc.*, vol. 125, pp. 566-572, (1978).
D. A. Cusano, "CdTe Solar Cells & Photovoltaic Heterojunctions in II-VI Compounds", *Solid-State Electronics*, vol. 6, pp. 217-232 (1963).
R. O. Bell et al, "A New Look at CdTe Solar Cells", *Conf. Record, 11th IEEE Photovoltaic Specialists Conf.*, (1975), pp. 497.
R. W. Aldrich et al, "New Work on CdTe Thin Film Solar Cells", *Conf. Record, IEEE Photovoltaic Specialists Conf.*, (1967), pp. 188-200.

*Primary Examiner*—Aaron Weisstuch
*Attorney, Agent, or Firm*—Amster, Rothstein & Engelberg

[57] ABSTRACT

Photovoltaic cell comprises thin film cadmium telluride in ohmic contact with a smooth conductive substrate, preferably comprising a cadmium surface, through a cadmium-rich layer at the interface with the substrate, the cell further including a rectifying barrier layer. Preferably, the film is electrodeposited on the substrate surface with specific materials and process conditions. Preferably also, the film or cell is subsequently treated to enhance its barrier layer interface function.

24 Claims, 1 Drawing Figure

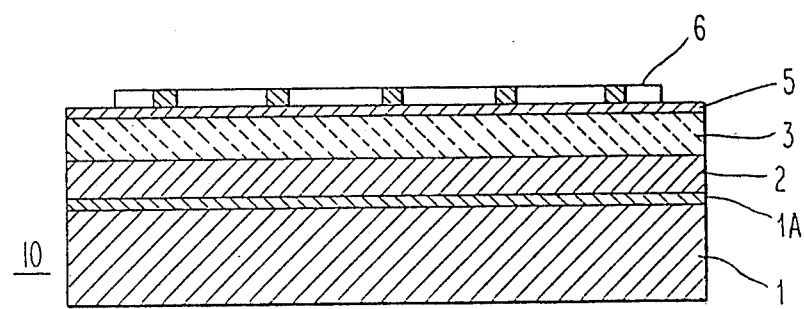

CDTE SCHOTTKY BARRIER PHOTOVOLTAIC CELL

This invention pertains to photovoltaic cells and methods for making such cells. More particularly, this invention pertains to improved thin film cadmium telluride cells of much improved efficiency, and low cost, as compared to those heretofore available.

Cadmium telluride is a semiconductor whose electronic properties have long been recognized as ideally suited for photovoltaic conversion of sunlight. In particular, its band gap energy is 1.45 electron volts, which is optimal for solar radiation reaching the earth.

Indeed, various research groups have made CdTe solar cells. However, much of this work is restricted to the use of single crystal cadmium telluride which is an expensive material obtained by slowly growing a crystal from a melt containing cadmium and tellurium.

Other workers (e.g. D. A. Cusano, CdTe SOLAR CELLS AND PHOTOVOLTAIC HETEROJUNCTIONS IN II-VI COMPOUNDS, Solid-state Electronics, Pergamon Press 1963, Vol. 6, pp. 217–232) have made solar cells from polycrystalline CdTe, which is prepared by the much cheaper process of vapor deposition. However, it still necessitates the use of elevated temperatures and special deposition equipment.

In U.S. Pat. No. 3,982,260, Wald discloses photovoltaic cells in which CdTe is vapor deposited on, and forms an ohmic contact with, a substrate of iron or iron coated with indium or, ". . . a metal other than indium, or an other semiconductor, (e.g. aluminum, tin telluride or lead telluride) . . . used to bond cadmium telluride to the iron substrate" (Col. 4, lines 48-51).

Raychaudhuri (U.S. Pat. No. 4,035,197) prepared polycrystalline solar cells from hot-pressed CdTe powder. Pre-heating the CdTe in an oxygen-containing atmosphere prior to deposition of the barrier layer was said to produce a $TeO_2$-rich surface layer adapted to enhance the open-circuit voltage of the cell. Raychaudhuri also taught that the CdTe could be doped n-type by annealing in a cadmium atmosphere.

A much simpler and less costly method for material deposition is electrodeposition. And techniques for electrodepositing CdTe are known. McEwan et al (U.S. Pat. No. 3,887,446) describe an electrolytic method in which a tellurium anode and cadmium cathode are immersed in an acidic buffer solution with the resultant formation of a CdTe precipitate. Similarly, Ammerman et al (U.S. Pat. No. 3,419,484) electrodeposited various metal-telluride compounds in sponge form.

Danaher et al (Photoelectrochemical Cell With Cadmium Telluride Film, *Nature*, Vol. 271, No. 5641, p. 139, Jan. 12, 1978) and Panicker et al, CATHODIC DEPOSITION OF CdTe FROM AQUEOUS ELECTROLYTES, *J. Electrochem. Soc.* pp. 566–572 (April 1978) both prepared CdTe by cathodic electrodeposition using an acidic electrolyte. Danaher et al deposited the CdTe, from a stirred solution, onto a sanded and degreased titanium substrate. This coated substrate is said to have a photovoltaic power conversion efficiency extrapolated to be 2%–4%, with respect to light incident on the film. But the film is immersed in an electrolyte of a photoelectrochemical cell and actual measured conversion efficiency, with respect to light incident on the cell, is said to be 0.4% or less.

Panicker discusses the general possibility of anodic, as well as cathodic, deposition of CdTe. More specifically, Panicker et al discloses a range of process conditions for electrodepositing CdTe of varying stoichiometry from stirred baths consisting essentially of $CdSO_4$ and $TeO_2$. The presence of free cadmium in the deposit is discussed with reference to specific process conditions but no special significance is attributed to such deposits. Annealing the film is said to increase its grain size and increased stirring is said to increase the current density required to produce exactly stoichiometric CdTe.

Apparently following the teaching of Panicker et al, Monosolar, Inc., under a Department of Energy contract, formed heterojunction solar cells as reported in Monosolar, Inc., DOE Photovoltaic Systems Program Summary, p. 102, December 1978 (Department of Energy Publication No. DOE/ER-0075), Monosolar, Inc. DOE Contract No. EX-76-C-01-2457, Quarterly Report No. 6, Nov. 30, 1977, and University of Southern California Periodic Report for Aug. 1-Oct. 31, 1977, under DOE Contract No. EX-76-C-01-2457, USC Account No. 53-4510-1834. Monosolar's cell structure is formed by electrodepositing arsenic-doped p-type CdTe onto glass substrates which have been coated with transparent n-$In_2O_3$:Sn. Finally, an ohmic contact to the p-CdTe is formed by the use of a Te layer. In the University of Southern California sub-contract report, reference is made to the advisability of depositing onto $CdSn_2O_4$-coated glass. In each case, the junction between the substrate and the electrodeposit forms a rectifying junction, as contrasted with an ohmic junction.

Fahrenbruch et al (Recent Investigation of Metal Oxide Heterojunction Solar Cells—13th Photovoltaic Specialists Conference, June 1978) discuss efforts to make improved CdTe photocells by depositing onto CdTe (generally monocrystalline), a window layer of ZnO or indium-tin oxide, by sputtering or spray pyrolysis.

Notwithstanding these prior efforts of others to produce effective cadmium telluride photovoltaic cells, by methods including electrodeposition, and cadmium telluride deposition technology generally, there remains a continuing need for more efficient and less expensive photovoltaic cells and particularly for more efficient cadmium telluride photovoltaic cells and practical, inexpensive methods for making such cells.

It is the general objective of the present invention to provide such improved efficiency cells and more practical and inexpensive manufacturing processes.

More specifically, it is an object of the present invention to provide electrodeposition processes, for producing practical, efficient cadmium telluride photovoltaic cells, and the resultant products.

Briefly, the present invention comprises a photovoltaic cell having a cadmium telluride film with a barrier layer on one side (forming a rectifying junction therewith, e.g. a Schottky barrier layer) and a conductive layer on the other side, the conductive layer forming an ohmic junction with the film and the film having a relatively cadmium-rich surface at its ohmic junction interface. Preferably, this cadmium-rich ohmic junction interface surface is produced by electrodepositing the cadmium telluride film onto a cadmium substrate. Still more preferably, the cadmium telluride is n-type electrodeposited from either acidic or alkaline bath onto a substrate consisting of cadmium coated on a substrate having a rest potential in the electrodeposition bath lower than that of cadmium.

Preferably also, the cadmium telluride film is treated, such as by annealing in air or nitrogen atmosphere by chemical or electrical plasma etching or electrolytic treatment, to produce modified chemical and/or crystalline characteristics, adapted to receive the barrier layer coated thereon and which forms a rectifying junction therewith.

Preferably also, the completed photovoltaic cell is treated, such as by annealing in hydrogen, by electrolytic treatment, or by immersion in electrolytes, to produce modified chemical and electronic characteristics at the rectifying junction surface of the cadmium telluride, i.e. at the rectifying junction.

The barrier layer is also, in accordance with the preferred embodiment, overcoated with a patterned conductive material adapted to permit incident light to reach the barrier layer but to produce a good conductive connection therewith. Still further, the overlayer is preferably provided with an outer anti-reflective coating which can act as an encapsulant.

As to process, the preferred method for producing the more efficient cadmium telluride photovoltaic cells of the present invention is an electrodeposition process wherein a polished stainless steel substrate, provided with a thin gold strike overlayer in turn covered with a thin cadmium outer surface, forms a substrate for the electrodeposition of cadmium telluride from an acidic bath comprising cadmium sulfate and tellurium dioxide and having a pH of about 2.5 and a bath temperature of about 80° C. Still more preferably, the bath is continuously stirred, recirculated and filtered and is monitored, for deposition potential, by reference to a silver/silver chloride saturated reference electrode. Most preferably, the electrodeposition is carried out at a constant voltage of $-583$ mV ($\pm 5$ mV) with respect to the silver/silver chloride saturated reference electrode.

An even lower cost process uses a polished cold rolled steel substrate which is directly covered by a thin cadmium outer surface thereby eliminating the intermediate gold layer. The electrodeposition of the CdTe follows as in the above paragraph.

For a better understanding of the present invention, reference may be made to the detailed description thereof which follows, taken in conjunction with the subjoined claims and the appended figure, which is a diagrammatic cross-sectional view of the preferred photovoltaic cell of the present invention.

In the FIGURE, there is shown a photovoltaic cell 10 made in accordance with the preferred embodiment of the present invention. More specifically, cell 10 comprises a polished stainless steel substrate 1 with a thin gold contact layer 1(a) and a cadmium surface layer 2. Over cadmium surface layer 2 is disposed the cadmium telluride photovoltaic film 3, in turn coated with a gold barrier layer 5 and a metallic patterned finger grid 6. Conductive or ohmic junctions are formed between stainless steel substrate 1, gold overlayer 1(a) and cadmium surface layer 2, and in turn at the interface between cadmium surface layer 2 and cadmium telluride film 3. A barrier or rectifying junction layer is formed between cadmium telluride film 3 and the gold barrier layer 5 at their interface, while the metallic finger grid 6 is adapted to make good conductive contact with barrier layer 5 but to permit incident light to reach barrier layer 5 in the surface thereof not covered by the patterned finger grid 6.

The improved efficiency of the photovoltaic cell of the present invention is believed attributable, at least in part, to the nature of the ohmic junction between the cadmium telluride 3 and the cadmium surface layer 2, at their interface. This may result from a slight cadmium enrichment of the cadmium telluride stoichiometry at the cadmium surface interface.

Similarly, the surface of cadmium telluride film 3 at its rectifying junction interface with barrier layer 5 may be better adapted to receive barrier layer 5 for producing more efficient cells, by annealing or other chemical or electrolytic treatment. Such treatments as described more fully hereinafter, are believed to modify the chemical and/or crystalline characteristics of the cadmium telluride film at the surface thereof in contact with barrier layer 5. Still further enhancement results from certain treatments of the cell after barrier layer deposition.

The preferred method for making a cell of the type shown in the FIGURE comprises first polishing a stainless steel substrate to facilitate the subsequent electrodeposition of thin, pinhole-free layers thereon. The polishing method may be either mechanical or electrolytic.

To mechanically polish the stainless steel substrate, alumina abrasive in the size range of 1 μm to 0.1 μm particle size is used on a conventional wet polishing wheel to polish the stainless steel substrate to a mirror finish. Alternatively, the stainless steel substrate is electropolished by immersing it in concentrated phosphoric acid ($H_3PO_4$) at 50°-60° C. The stainless steel is made anodic with respect to a carbon cathode using a constant voltage power supply. Samples having an area of about 25 cm² require a current of 3-5 Amperes. The electrolyte is agitated strongly using a magnetic stirrer. The electropolishing treatment is typically carried out for 15 minutes.

The polished stainless steel substrate is then given a gold overlayer (about 2700 Å) by a commercially available acid gold strike solution (such as Orostrike, sold by Technic, Inc., P.O. Box 965, Providence, R.I. 02901). This gold overlayer is deposited at a constant current density of 410 mA/cm² for about 15 seconds, from a bath at 60° C., using platinized titanium screen as a counterelectrode.

This gold-coated stainless steel substrate then serves as a base for the deposition of a thin (about 1000 Å) layer of cadmium, electrodeposited from a commercial cadmium cyanide bath at room temperature.

Onto this smooth cadmium-surfaced substrate, cadmium telluride is electrodeposited to form an excellent ohmic junction with the cadmium-surfaced substrate, the electrodeposited cadmium telluride being cadmium-rich at its junction with the 1000 Å cadmium layer. This is believed at least in part responsible for the excellent ohmic junction and for the overall efficiency of the cell ultimately produced.

The cadmium telluride is deposited from an aqueous bath comprising a 1.2 Molar $CdSO_4$ solution saturated with $TeO_2$, the pH of the bath being 2.5 and the bath temperature being about 80° C. (this compares with the Panicker et al deposition conditions of 1.2 Molar $CdSO_4$ saturated with $TeO_2$, a pH of 3.4, a bath temperature of 85° C. and a significantly different substrate.)

In this electrodeposition bath, the possible detrimental effects of undissolved tellurium and other inhomogeneities, which could possibly lead to the presence of inclusions in the final deposit or shorts in the solar cell, are eliminated by continuously recirculating the electrolyte, while stirring the bath vigorously with a magnetic stirrer and filtering the recirculating electrolyte.

Still further, the high quality of the cadmium telluride deposit is maintained by electrodepositing at a constant, and apparently optimal deposition voltage for n-cadmium telluride in this electrolytic bath, of $-583$ mV $\pm 5$ mV. This potentiostatic deposition produces a homogeneous and stoichiometric cadmium telluride film.

Deposition potential is controlled with respect to a silver/silver chloride saturated reference electrode. The saturated calomel electrode used by Panicker et al is specifically avoided to avoid poisoning of the plating bath with mercury and also to preclude deterioration of the reference electrode during the electrodeposition at elevated temperature.

In order to deposit cadmium telluride at the optimum deposition voltage, it is essential that the deposition substrate have a rest potential which is more positive than that of the optimum deposition voltage. Thus, it has been found that in this preferred bath, deposition onto plain cadmium stock (having a rest potential of $-615$ mV) or cadmium plated to 0.001" on stainless steel (having a composite rest potential of $-612$ mV) produced deposits of non-optimized stoichiometry.

In contrast, cadmium, plated to a thickness of 1000 Å on stainless steel with a 2700 Å thick intermediate gold layer, has a rest potential of $-572$ mV, slightly more positive than the preferred plating voltage of $-583$ mV. It is apparent that the rest potential of the substrate then is a composite of the complex substrate. Stainless steel, having a rest potential of $+275$ mV, and gold, having a rest potential of $+300$ mV in the electrodeposition solution, tend to lower significantly the rest potential of the composite in which the cadmium surface layer provides the immediate substrate for cadmium telluride deposition.

The electrodeposited cadmium telluride film formed in this manner also maintains good ohmic contact with the cadmium surfaced substrate even during subsequent heat treatment of the cadmium telluride film, an important characteristic in producing the high efficiency cell which is the ultimate objective of this process.

While the thickness of the cadmium telluride layer is not critical, it is desirable to minimize this thickness in order to minimize materials used and deposition time. In this regard, cadmium telluride layers as thin as 1 μm have been found to give efficient solar cells. The practical thickness range is believed to be about 0.5 to 5 microns.

The next step in the manufacture of the photovoltaic cell is to deposit a barrier layer on the cadmium telluride film. This is sometimes referred to as a Schottky barrier and generally comprises an overlayer, forming at its interface with the cadmium telluride film, a rectifying junction. In the preferred form of the present invention, a thin (80 Å) semi-transparent layer of gold is vacuum deposited on the electrodeposited cadmium telluride film. In accordance with known technology, the difference between the work function of the gold and the electron affinity of the cadmium telluride gives rise to a space charge at the interface between these two materials. The electric field produced by this space charge then acts to separate charged carriers of opposite sign which are created by incident photons. Solar cells of small area produced in accordance with the method just described have AM1 efficiencies of up to 1.5%.

Preferably, however, cells of higher efficiency are produced by further treatment of the cadmium telluride. This may be done by processing steps prior to deposition of the barrier layer (sometimes referred to as "pre-treatments"), the effect of which may be to modify the crystal grain size of the cadmium telluride or to render the cadmium telluride barrier layer interface surface either oxide-rich or tellurium-rich, or to produce some combination of these effects.

Still further treatment of the cadmium telluride, following barrier layer deposition, is also part of the preferred process of the present invention. In these further processing steps (sometimes referred to as "post-treatments"), the cell is annealed in hydrogen and/or immersed in various electrolytes, the effect of which is to act on the cadmium telluride/barrier interface so as to improve its rectifying characteristics.

Typical pre-treatments include:

A. Nitrogen Anneal

One of the limitations in the output of the as-deposited CdTe solar cell is the small crystal grain size. In addition, the as-deposited CdTe has a high resistivity. These undesirable effects can be ameliorated to some extent by nitrogen annealing the cadmium telluride. Thus, the cadmium telluride can be treated in a nitrogen atmosphere at an elevated temperature, on the order of 250° C. for 60 minutes, before Schottky barrier layer deposition, to increase significantly the efficiency of the cell.

B. Oxidizing Atmosphere Anneal

This is an annealing treatment which is similar to the nitrogen anneal in that it will increase the crystal grain size. However, in addition it will grow an oxide layer on the surface of the cadmium telluride layer. This oxide layer enhances the open circuit voltage of the cells.

C. Anodic treatment in Alkaline Electrolyte

The problem of low shunt resistance across the cell can be ameliorated by impressing a positive voltage on the cadmium telluride film (prior to deposition of barrier layer) while it is immersed in an alkaline solution.

D. Flame Treatment

Still another means for improving the photovoltaic efficiency in accordance with the present invention and specifically for increasing the crystal grain size of the cadmium telluride at the rectifying junction surface is to treat the cadmium telluride film by passing it through a hot propane flame for a brief period of time on the order of ¼ to 3 seconds. This procedure gives an increase in the short circuit current.

One treatment, which may be considered a combination of pre and post-treatments, is that referred to as the "Etch and Hydrogen Anneal". In this procedure, surface roughness and nonuniformities of the cadmium telluride film are reduced by an etching with a chemical etchant, such as a mixture of bromine and methanol. The barrier layer is then deposited on the etched surface and then the cell is annealed in a hydrogen atmosphere. Typical experimental conditions for this treatment include the use of a bromine/methanol solution comprising 1000 parts methanol to 1 part bromine, with an etch time of about 10 seconds and a subsequent annealing temperature (following barrier layer deposition) in a hydrogen atmosphere of about 150° C.

Typical post-treatments include:

E. Immersion in Alkaline Solution

This treatment generally follows air annealing and consists of immersion of the cadmium telluride in a 25 weight % KOH solution for a time on the order of 5–15 minutes.

F. Cathodic Treatment in Alkaline Electrolyte

Photovoltaic efficiency is also improved in the photovoltaic cells of the present invention by impressing a negative voltage on the film while it is immersed in an alkaline solution.

Typical conditions for this procedure are:
electrolyte: 86 vol. % of $NH_4OH$ concentrated solution; 14 vol. % of 45% KOH solution
current: 3 $mA/cm^2$
immersion time: 5-30 seconds

G. Hydrazine Treatment

Improved efficiency is also obtained in the photovoltaic cells of the present invention by treatment of the cells by immersion in a concentrated solution of hydrazine ($H_2NNH_2$). Generally, this procedure improves the open circuit voltage, short circuit current and fill factor simultaneously, although the exact reasons for this improvement have not been verified. Typical immersion time is on the order of 20 minutes at room temperature.

It should be understood that the foregoing cadmium telluride treatment steps have not been fully optimized, nor are they mutually exclusive. Indeed, they are best used in combination although the optimum sequence also has not been established. To illustrate the enhanced efficiency obtained by these various treatments, the following table lists the photovoltaic efficiency (AM1) for photovoltaic cells produced in accordance with the present invention and with cadmium telluride film modifications utilizing the treatment sequence described in the table.

TABLE

| | Treatment | Efficiency (AM1) |
|---|---|---|
| 1. | Untreated CdTe | 1.04% |
| 2. | Nitrogen annealed at 250° C. for 60 minutes (Barrier layer deposition) | 1.89% |
| 3. | Hydrazine treatment for 1 minute | 2.6% |
| 4. | Additional hydrazine treatment for 1 additional minute | 3.8% |
| 5. | Cathodic treatment in $NH_4OH/KOH$ | 4.2% |

In other tests, photovoltaic cells with AM1 efficiencies in excess of 5% have been obtained without the use of anti-reflective coating. With a well-designed anti-reflective coating, it is believed that photovoltaic cells in accordance with the present invention will exceed 6% efficiency, even without further optimization.

As of this time, the preferred treatment sequence is:
Pre-Barrier Layer Deposition
1. Air anneal at 300° C. and 60 minutes; (Barrier layer deposition)

Post-Barrier Layer Deposition
2. Immersion in 25 weight % KOH solution at room temperature for 5 minutes;
3. Immersion in concentrated hydrazine for 3 minutes at room temperature.

For large area photovoltaic cells, the Schottky barrier does not suffice as a top electrode because of its high sheet resistance. Therefore, a grid of metallic fingers is deposited over the Schottky barrier layer. Generally, an anti-reflective coating is also applied over the metallic finger grid and the barrier layer to minimize reflections from the front surface, in accordance with known technology.

In the foregoing preferred photovoltaic cell and method of manufacture of same, the gold underlayer, and the gold barrier layer add significantly to the cost of the photovoltaic cell. Elimination of the gold underlayer has been achieved in several test cells by electrodepositing cadmium directly onto polished cold rolled steel substrates. Substitution of less expensive material is also expected to be feasible for the barrier layer but cells in which this modification is incorporated have not yet been optimized. In this regard, high work function metal or alloys would appear most promising for n-type CdTe cells.

As an alternative to the acid deposition process for producing the cadmium telluride film in the photovoltaic cell of the present invention and as a novel method for electrodepositing cadmium telluride generally, an alkaline deposition process has been devised. In accordance with this process, smooth, thin, adherent cathodic cadmium telluride deposits in a composition range of 0.85 to 1.3 atoms of cadmium per atom of tellurium have been produced. Such cadmium telluride film has been demonstrated to exhibit a photovoltaic response when appropriately combined with a Schottky barrier layer. To date, such cells have been produced utilizing the cadmium surfaced, gold-coated stainless steel substrate optimized for purposes of the acid deposition process described above, but it is believed that the alkaline electrodeposition process is not limited thereto. Similarly, the photovoltaic cells produced to date utilizing the alkaline bath deposited cadmium telluride film have utilized a gold barrier layer. However, the semiconductive cadmium telluride film electrodeposited in this manner may be utilized in other semiconductor applications and in other types of photovoltaic cells.

In any event, in accordance with this process, stoichiometric cadmium telluride (cadmium to tellurium atomic ratio of 1:1) has been produced with good deposits obtained over a wide range of solution compositions, temperatures and cathode current densities. These baths exhibit high throwing power and, due to the high solubility of tellurium at elevated pH, these baths permit plating at high current densities, which provides a considerable advantage over the acid deposition process described above.

For reasons of ease of maintaining solution composition stability and prolonged bath life, relatively concentrated baths of pH greater than 11 are desired. Solubilized Cd(II) at 2 to 15 g/l, Te(IV) at 5 to 30 g/l and free $CN^-$ at 0.5 to 2 gram atom per liter are desired. Bath temperatures of 60°-85° C. have been found desirable. Low solution pH and high solution temperatures create (each their own) the problem of maintaining $CN^-$ levels constant. A pH less than 11 allows $CN^-$ loss as volatile HCN and high temperatures allow a higher rate of $CN^-$ hydrolysis and also $CN^-$ oxidation in baths not protected from air. Solution pH values greater than ca. 13 with unprotected baths are also not desired (especially if the solution is not pH buffered) partly because $CO_2$ absorption slowly lowers solution pH.

The source of cadmium (II) may be a water soluble Cd salt, e.g., $CdCl_2$ or $CdSO_4$, but CdO and/or $Cd(OH)_2$ is preferred for ease of pH control and to prevent long-term build-up of soluble sulfates and/or chlorides in the bath as the Cd component is replenished.

The tellurium (IV) source is $TeO_2$ for the same reasons that Cd is added as an oxide. Other Te sources could be used.

Cyanide ion is usually added as KCN but other soluble cyanides, e.g., those of other alkali metals and even gaseous HCN could be used.

Solution pH buffers have been used in some cases to reduce pH drifts.

TeO$_2$ is easily solubilized in high concentrations by strong bases. KOH has been used but other alkali metal oxides and/or hydroxides could be used. NH$_4$OH and/or organic amines may also be used.

Ratios of solubilized Cd:Te:CN are important in determing product stoichiometry, cathode voltage current density ranges and end treatments needed for good photovoltaic response of fabricated cells.

Good films have been prepared under either constant cathode voltage or constant current density conditions. A variety of anodes can be used. Possibilities include a soluble Cd and a soluble Te anode with split anode current. Additionally, inert anodes can be employed.

Successful runs at cathode current densities from 0.1 to greater than 5.0 mA/cm$^2$ with high CdTe current efficiencies have been made. Introducing substrates for a cathodic plating into the bath electrically hot and removing the CdTe plated cathode electrically hot are desirable steps in the plating procedure.

A special procedure has been developed to plate under modified constant current conditions and to obtain good film over a current density range unavailable without it.

This procedure overcomes the problem of excessively high current density on the bottom (leading edge) of the cathode during that short time during which it is being immersed into the solution electrically hot and removed electrically hot.

Under constant voltage mode, plating cell current generally decreases as a function of run time, because semiconducting CdTe is being plated. For those solution compositions and voltages which exhibit large current decrease as the plating proceeds, resulting in uneconomically long plating time requirements for deposition of sufficiently thick CdTe films, plating is started in the constant voltage mode, then switched to a constant current mode for most of the run and switched back to constant voltage mode just before the sample is removed from the bath.

More specifically, a preselected voltage (the value of which will depend upon bath composition and temperature and which has been selected to give the desired initial cathode current density), is applied to the cathode as it is immersed electrically hot, into the plating bath. As electrolysis proceeds and as the current drops to the value at which one wishes to complete the deposition, the power supply is switched to constant current mode, at the preset current value. The run is completed as a constant current run. Just before removal from solution, electrically hot (which protects the CdTe from the uncontrolled Cd, Te(IV) cementation reaction), the power supply is again switched to constant voltage mode. Thus, desired cathode current densities can be maintained while eliminating the undesired high current densities which obtain at the leading edge when samples are immersed and removed from baths, electrically hot.

To date, gold Schottky barrier layer cells prepared from CdTe samples from this basic, cyanide bath have demonstrated up to 1.7% conversion efficiency in converting sunlight to electrical energy. There are reasons to believe that such cell efficiencies can be increased. Parameters, e.g., film treatment to modify crystalline size, degree of amorphous vs. crystalline character, grain boundary contaminants, appropriate dopants plus many other factors known to greatly influence cell efficiencies, have not yet been optimized, either generally or specifically with reference to alkaline deposited CdTe.

Following are examples of specific bath compositions and plating conditions used with the alkaline deposition process just described:

| Bath Composition | | | | | Plating Conditions | | | |
|---|---|---|---|---|---|---|---|---|
| Cd(II) (g/l) | Te(IV) (g/l) | CN$^-$ m/l | pH | Temp (°C.) | Current Density mA/(cm)$^2$ | Cathode Voltage[1] (mV) | Plating Time (Min) | Thickness[2] of CdTe (μm) |
| 3.2 | 22 | 0.75 | 11.4 | 60 | 2.5→.6 | 1220 | 30 | 1.0 |
| 3.2 | 22 | 0.75 | 11.4 | 60 | 4.5→.5 | 1400[3] | 30 | 1.4 |
| 3.2 | 22 | 0.75 | 11.4 | 60 | 1.5 |  | 30 | 1.6 |
| 3.0 | 10 | 0.75 | 11.5 | 60 | 1.5→1.2 | 1300 | 10 | 0.5 |
| 3.0 | 10 | 0.75 | 11.5 | 84 | 1.0→.7 | 1200 | 30 | 1.2 |
| 3.0 | 10 | 0.75 | 11.5 | 60 | 0.5→.4 | 1200 | 30 | 1.2 |

[1] Stated value is relative to a Ag/AgCl (sat'd) reference electrode with the cathode polarity negative with respect to the reference.
[2] Thicker deposits can of course be made by extending run time.
[3] Initial current density is 2.5 mA/cm$^2$ at constant voltage (1200 mV) to one minute; then constant current density (1.5 mA/cm$^2$) to 30 minutes; then constant voltage (1380 mV) to withdrawal.

An important consideration in bath composition is that there is apparently an upper and lower limit in the soluble Cd(II)/cyanide-ion ratio which can be used. This indicates that within the series of $[Cd(CN)_x]^{+2-x}$ complex ions which form, the electroactive species is apparently not the predominant, x=4, complex but some low concentration of intermediate species where x=1, 2 or 3.

Deposition of CdTe in the bath used in the examples cited above (containing 3 g/l cadmium and 10 g/l tellurium) occurs in a range of cyanide-ion concentration between about 0.5 and 0.9 Molar.

While this invention has been described with reference to specific embodiments thereof, it should be understood that it is not limited thereto and the appended claims are intended to be construed to encompass not only those embodiments of the invention described but such variations of these embodiments and other forms of the invention which may be made by those skilled in the art without departing from the invention's true spirit and scope.

We claim:

1. In a photovoltaic cell comprising (a) a cadmium telluride film, (b) a barrier layer facing and in intimate contact with one side of said film with a rectifying junction at the interface therebetween and (c) a conductive layer facing and in intimate contact with the other side of said film with an ohmic junction at the interface therebetween, the improvement comprising:

said film being relatively cadmium-rich at said ohmic junction interface.

2. An improved photovoltaic cell, as recited in claim 1, wherein said conductive layer is cadmium.

3. An improved photovoltaic cell, as recited in claim 2, wherein said cadmium conductive layer is a thin overlayer on a gold-coated, stainless steel substrate with which said cadmium conductive layer is in ohmic contact.

4. An improved photovoltaic cell, as recited in claim 2, wherein said cadmium conductive layer is a thin overlayer on a cold-rolled steel substrate with which said cadmium conductive layer is in ohmic contact.

5. An improved photovoltaic cell, as recited in claim 1, wherein said film is n-type cadmium telluride.

6. An improved photovoltaic cell, as recited in claim 1, wherein said film is 0.5–5 microns thick.

7. An improved photovoltaic cell, as recited in claim 1, wherein said film is relatively tellurium-rich at its rectifying junction interface.

8. An improved photovoltaic cell, as recited in claim 1, wherein said film includes an oxide-rich outer layer at its rectifying junction interface.

9. An improved photovoltaic cell, as recited in claim 1, wherein said barrier layer is gold.

10. An improved photovoltaic cell, as recited in claim 1, wherein said barrier layer includes a conductive material overcoat in a pattern to facilitate making electrical contact with said barrier layer while permitting a high proportion of incident light to reach said barrier layer.

11. An improved photovoltaic cell, as recited in claim 1, further including an anti-reflective coating overlying said barrier layer.

12. An improved photovoltaic cell, as recited in any one of claims 5, 6, 7, 8, 9, 10 or 11, wherein said conductive layer is cadmium.

13. An improved photovoltaic cell, as recited in any one of claims 5, 6, 7, 8, 9, 10 or 11, wherein said cadmium conductive layer is a thin overlayer on a gold-coated, stainless steel substrate with which said cadmium conductive layer is in ohmic contact.

14. An improved photovoltaic cell, as recited in any one of claims 5, 6, 7, 8, 9, 10 or 11, wherein said cadmium conductive layer is a thin overlayer on a cold-rolled steel substrate with which said cadmium conductive layer is in ohmic contact.

15. An improved photovoltaic cell, as recited in any one of claims 3, 4, 7, 8, or 9, wherein said film is n-type cadmium telluride 0.5–5 microns thick.

16. In a photovoltaic cell comprising (a) a cadmium telluride film, (b) a barrier layer facing and in intimate contact with one side of said film with a rectifying junction at the interface therebetween and (c) a conductive layer facing and in intimate contact with the other side of said film with an ohmic junction at the interface therebetween, the improvement comprising:
said conductive layer is cadmium and said film is n-type cadmium telluride.

17. An improved photovoltaic cell, as recited in claim 16, wherein said cadmium conductive layer is a thin overlayer on a gold-coated, stainless steel substrate with which said cadmium conductive layer is in ohmic contact.

18. An improved photovoltaic cell, as recited in claim 16, wherein said cadmium conductive layer is a thin overlayer on a cold-rolled steel substrate with which said cadmium conductive layer is in ohmic contact.

19. An improved photovoltaic cell, as recited in claim 17, wherein said cadmium telluride film is 0.5–5 microns thick.

20. An improved photovoltaic cell, as recited in claim 19, wherein said cadmium telluride film includes an oxide-rich outer layer at its rectifying junction interface.

21. An improved photovoltaic cell, as recited in claim 20, wherein said barrier layer is gold.

22. An improved photovoltaic cell, as recited in claim 21, wherein said barrier layer is overcoated with a conductive material in a pattern to facilitate making electrical contact with said barrier layer while permitting a high proportion of incident light to reach said barrier layer.

23. An improved photovoltaic cell, as recited in claim 22, further including an anti-reflective coating overlying said barrier layer.

24. An improved photovoltaic cell, as recited in claim 19, wherein said film includes an oxide-rich outer layer at its rectifying junction interface, said barrier layer is gold and includes a conductive material overcoat in a pattern to facilitate making electrical contact with said barrier layer while permitting a high proportion of incident light to reach said barrier layer and wherein said barrier layer further includes an anti-reflective coating overlying said barrier layer.

* * * * *